United States Patent
Li et al.

(10) Patent No.: US 8,722,287 B2
(45) Date of Patent: May 13, 2014

(54) PHASE SHIFT FOCUS MONITOR RETICLE, MANUFACTURING METHOD THEREOF AND METHOD FOR MONITORING FOCUS DIFFERENCE

(71) Applicant: Shanghai Huali Microelectronics Corporation, Shanghai (CN)

(72) Inventors: Wenliang Li, Shanghai (CN); Peng Wu, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 4 days.

(21) Appl. No.: 13/688,407

(22) Filed: Nov. 29, 2012

(65) Prior Publication Data

US 2013/0137016 A1 May 30, 2013

(30) Foreign Application Priority Data

Nov. 30, 2011 (CN) .......................... 2011 1 0392792

(51) Int. Cl.
*G03F 1/26* (2012.01)
*G03F 1/44* (2012.01)

(52) U.S. Cl.
USPC ................................. 430/5; 430/30

(58) Field of Classification Search
CPC ..................................... G03F 1/26; G03F 1/44
USPC ....................................................... 430/5, 30
See application file for complete search history.

(56) References Cited

U.S. PATENT DOCUMENTS 7,119,893 B2 * 10/2006 Littau et al. ................... 356/124

* cited by examiner

*Primary Examiner* — Christopher Young
(74) *Attorney, Agent, or Firm* — Anova Law Group, PLLC

(57) ABSTRACT

The invention provides a phase shift focus monitor reticle, a manufacturing method thereof, and a method of monitoring focus difference using the phase shift focus monitor reticle. The phase shift focus monitor reticle comprises a shield comprising a plurality of light-transmitting portions with a certain width; and a glass layer positioned on the shield layer comprising a plurality of openings at the light-transmitting portions; wherein the width of the openings is half of the width of the light-transmitting portions; the depth of the openings is $n*\lambda/(N-1)$, wherein $\lambda$ is the wavelength of the lights incident on the phase shift focus monitor reticle in air, N is the refractive index of the glass layer, n is a positive integer. The invention can be applied to thicker photoresist and different process machines.

6 Claims, 3 Drawing Sheets

PHASE SHIFT FOCUS MONITOR RETICLE, MANUFACTURING METHOD THEREOF AND METHOD FOR MONITORING FOCUS DIFFERENCE

CROSS-REFERENCE TO RELATED APPLICATION

This application claims the priority benefit of China application serial no. 201110392792.8, filed Nov. 30, 2011. All disclosure of the China application is incorporated herein by reference.

FIELD OF THE INVENTION

The present invention relates to the field of microelectronics, and more particularly to a phase shift focus monitor reticle, a manufacturing method thereof, and a method of monitoring focus difference.

BACKGROUND OF THE INVENTION

The lithography machine takes an important role in the manufacturing and production of semiconductor devices such as VLSIs, sensors, surface wave components, magnetic bubble devices, microwave devices, and CCDs, etc. In the photolithographic process, the patterns on the mask are transferred to the photoresist coated on the surface of the wafer by the exposure process, and then transferred to the wafer by developing and etching. The photolithographic process determines the critical dimension of the VLSI and is a critical process in the manufacturing of the VLSI.

The focus of the lithography machine is an important parameter of the product performance, which needs to be monitored regularly. The PSFM (Phase Shift Focus Monitor) reticle changes the vertical distance between the lights into a horizontal distance. Therefore, the focus difference of the lithography machine can be calculated by measuring the horizontal distance between the outer box and the inner box of the "box-in-box" overlay marks exposed on the wafer using an overlay measuring machine. As shown in FIG. 1, which is a schematic diagram of the conventional PSFM reticle, the PSFM reticle comprises a glass layer 1 having multiple openings 2. In the three dimensional space, the lights vertically incident on the reticle (in the direction of the z-axis perpendicular to the surface of the glass) passes through the reticle and converts into two beams of light, one beam of light passes through the air in the opening 2 of the glass and the other beam of light passes through the whole glass 1. Since the wavelength of the light in the air is different from that of the light in the glass, the two beams of lights may interfere with each other, and the wavefront of the interfered lights changes from an original horizontal direction (the x-axis direction or the y-axis direction) into an inclined direction (between the x-axis direction and the y-axis direction). Since the direction of the emergent lights is perpendicular to the wavefront, the normal incidence lights will be changed to oblique emergent lights after passing through the openings 2. Therefore, the shifts of the emergent lights in horizontal vector (x vector or y vector) are different in the horizontal planes of different heights.

After the exposure process for the reticle, the overlay marks corresponding to the openings of the reticle will be formed on the wafer, the focus difference of the lithography machine may cause the overlay difference. FIG. 2 is a schematic diagram illustrating the conventional phase shift focus monitor reticle and the conventional method of monitoring the focus difference using the phase shift focus monitor reticle. As shown in FIG. 2, the conventional reticle comprises a glass layer 1 having multiple openings 2, a chrome outer box 3 and a chrome inner box 4 positioned below the glass layer 1. The normal incidence lights passing through the glass layer 1 changes into oblique emergent lights due to the interference, the chrome outer box 3 and the chrome inner box 4 below the glass layer 1 will limit the emergent lights in a certain range (as shown by the arrows below the chrome outer box 3 and the chrome inner box 4 in FIG. 2), wherein the chrome outer box 3 and the chrome inner box 4 are opaque. As shown in the right part of FIG. 2, the chrome outer box 3 and the chrome inner box 4 are not perfectly symmetrical, the shift between the middle of the chrome outer box 3 and the middle of the chrome inner box 4 in the x-axis direction is $\Delta x$. In the horizontal plane of the $Z_0$-axis, which has the BF (best focus) of the lithography machine, the shift (in the x direction or in the y direction) between the middle of the exposed patterns of the chrome outer box 3 and the chrome inner box 4 is measured to be $\Delta_0$ by the overlay measuring machine. If the focus of the lithography machine shifts from the plane of the $Z_0$-axis to the plane of the $Z_1$-axis, the measured shift between the middle of the exposed pattern of the chrome outer box 3 and the chrome inner box 4 in the plane of the $Z_1$-axis will be changed into $\Delta_1$ since the emergent light is oblique. Similarly, the shift between the middle of the exposed patterns of the chrome outer box 3 and the chrome inner box 4 in the plane of the $Z_2$-axis and that in the plane of the $Z_3$-axis will be measured to be $\Delta_2$ and $\Delta_3$, respectively. Therefore, when the reticle is exposed on the wafer with different focus, the shifts between the middle of the exposed patterns of the chrome outer box 3 and the chrome inner box 4 measured by the overlay measuring machine can be modeled, and further the linear relationship between the shift of the lights along the z-axis and the shift of the lights along the x-axis or the y-axis can be calculated. In the regular monitoring for the focus of the lithography machine, the shift of the lights along the z-axis can be calculated according to the linear relationship and the shift between the middle of the exposed patterns of the chrome outer box 3 and the chrome inner box 4 measured at that time. Since the focus difference has a corresponding relationship with the shift of the lights along the z-axis, the difference between the present focus of the lithography machine and the best focus thereof can also be obtained accordingly.

Due to the high accuracy and repeatability of the overlay measuring machine, the precision can be improved and the measuring time can be reduced by the monitoring method mentioned above. However, since the normal lights can be changed into oblique lights only in a limited range close to the openings (within the chrome outer box 3) in the reticle structure as shown in FIG. 2, the exposed patterns on the wafer to be measured by the overlay measuring machine are narrow line marks, and the photoresist coated on the wafer has to be thin enough to prevent the collapse of the photoresist in the narrow line marks.

SUMMARY OF THE INVENTION

Accordingly, at least one objective of the present invention is to provide a phase shift focus monitor reticle and a manufacturing method thereof to avoid the collapse of the photoresist in the line marks caused by the excessive thickness of the photoresist in the prior art.

To achieve these and other advantages and in accordance with the objective of the invention, as embodied and broadly described herein, the invention provides a phase shift focus monitor reticle comprising a shield layer and a glass layer; wherein the shield layer comprises a plurality of light-transmitting portions with a certain width; the glass layer is positioned on the shield layer and comprises a plurality of openings at the light-transmitting portions, wherein the width of the openings is half of the width of the light-transmitting portions; the depth of the openings is n*λ/(N−1), wherein λ is the wavelength of the lights incident on the phase shift focus monitor reticle in air, N is the refractive index of the glass layer, n is a positive integer.

The invention further provides a manufacturing method of the phase shift focus monitor reticle comprising etching a plurality of light-transmitting portions with a certain width in a shield layer respectively; etching a plurality of openings in the glass layer positioned on the shield layer at the plurality of the light-transmitting portions to form the phase shift focus monitor reticle; exposing the phase shift focus monitor reticle on the wafer to form space marks on the wafer, wherein the width of the openings is half of the width of the light-transmitting portions; the depth of the openings is n*λ/(N−1), wherein λ is the wavelength of the lights incident on the phase shift focus monitor reticle in air, N is the refractive index of the glass layer, n is a positive integer.

The invention further provides a method of monitoring the focus difference using the phase shift focus monitor reticle comprising: step a, exposing the phase shift focus monitor reticle on the wafer by the lithography machine to form space marks corresponding to the light-transmitting portions and the openings on the wafer; step b, modeling the shift between the middle of the outer box and the middle of the inner box of the space marks measured by an overlay measuring machine when the lithography machine exposing with different focus; step c, calculating the focus difference of the lithography machine according to the modeling result and the shift between the middle of the outer box and the middle of the inner box of the space marks.

Compared with the line marks formed on the wafer by the conventional reticle in the exposure process, space marks are formed by the phase shift focus monitor reticle in the present invention, which eliminates the collapse of the photoresist caused by the thick photoresist and the narrow line marks in the prior art and increases the applicability of the phase shift focus monitoring method to thicker photoresist and various process machines.

BRIEF DESCRIPTION OF THE DRAWINGS

The present invention will be elucidated by reference to the following embodiments and the accompanying drawings, in which.

DETAILED DESCRIPTION OF THE EMBODIMENTS

The present invention will be described in further details hereinafter with respect to the embodiments and the accompanying drawings. The specific embodiments discussed are merely illustrative of specific ways to make and use the invention, and do not limit the scope of the invention or the appended claims.

The phase shift focus monitor reticle and the manufacturing method thereof according to the present invention will be described in details hereinafter by referring to FIG. 3 to FIG. 5.

Figure 3:
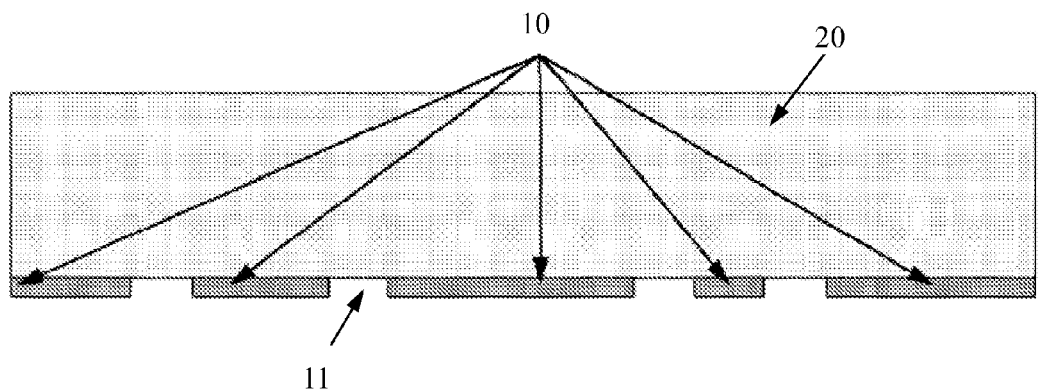
FIG. 3 and FIG. 4 are cross sectional views of the manufacturing method of the phase shift focus monitor reticle in one embodiment of the present invention.

As shown in FIG. 3, firstly, a plurality of light-transmitting portions 11 with a certain width are formed in a shield layer 10 by etching, wherein the shield layer 10 is below a glass layer 20 and the material of the shield layer 10 can be chrome; the plurality of the light-transmitting portions 11 can be formed anywhere in the shield layer 10.

Figure 1:
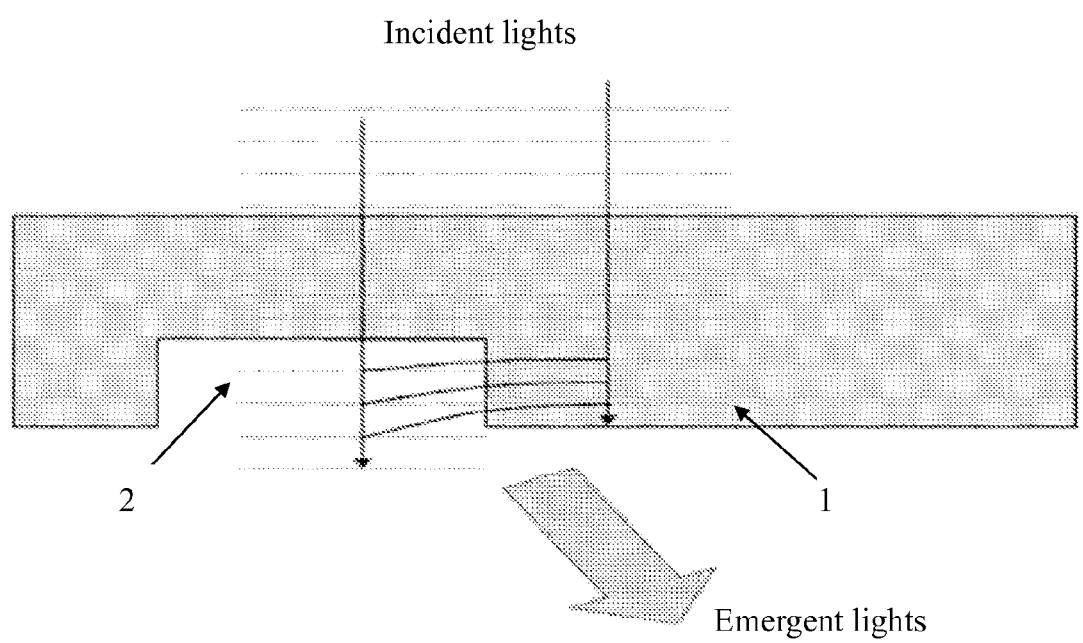
FIG. 1 is a schematic diagram of a conventional phase shift focus monitor reticle.
Figure 2:
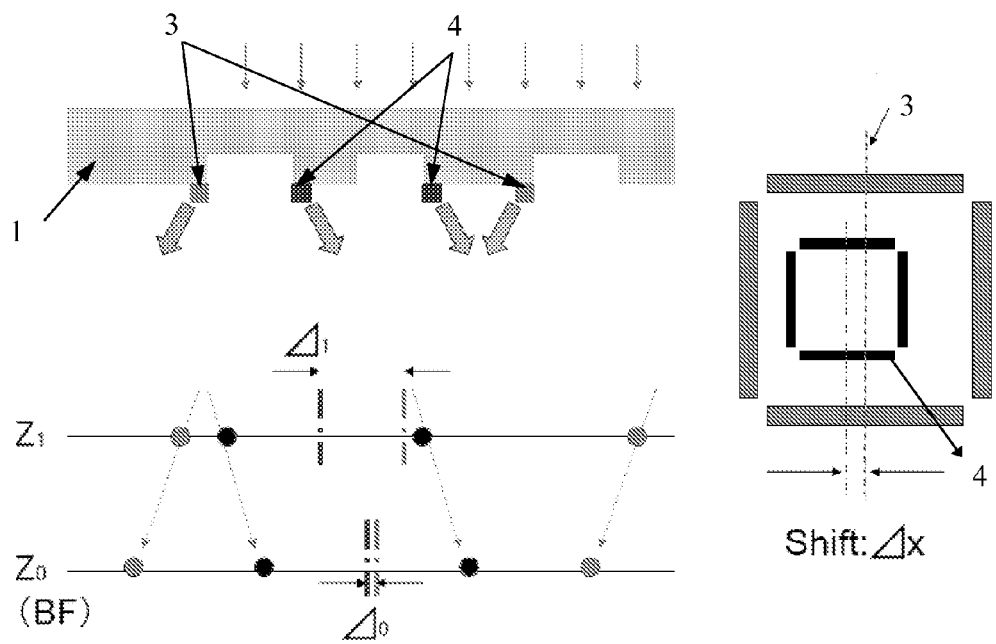
FIG. 2 is a schematic diagram of a conventional phase shift focus monitor reticle and the conventional method of monitoring the focus difference using the phase shift focus monitor reticle.
Figure 4:
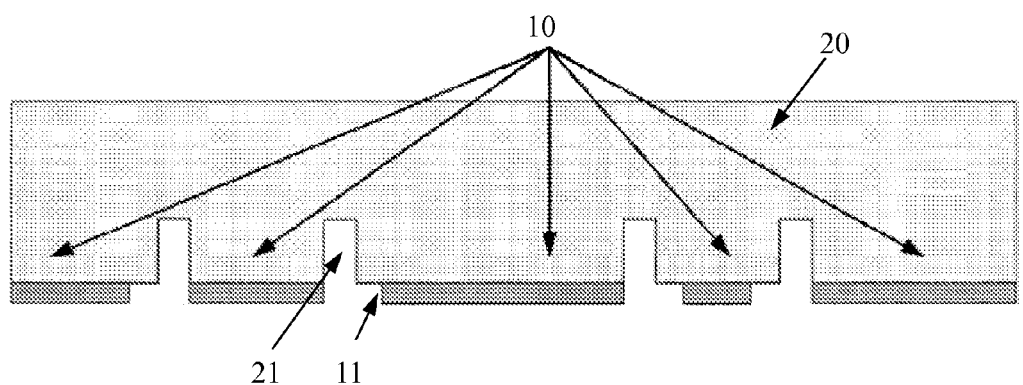

Then, as shown in FIG. 4, a plurality of openings 21 (similar to the openings illustrated in FIG. 1) are formed in the glass layer 20 at the plurality of the light-transmitting portions 11, and the phase shift focus monitor reticle is formed thereby. Wherein the width of the openings 21 can be half of the width of the light-transmitting portions 11, and the depth of the openings 21 can be nλ/(N−1) (λ is the wavelength of the lights incident on the phase shift focus monitor reticle in air, N is the refractive index of the glass layer, n is a positive integer), so as to enable the interference between the two beams of lights passing through the air and the glass layer 20, respectively. The openings 21 can be formed anywhere in the glass layer 20 corresponding to the light-transmitting portions 11 formed in the shield layer 10, which is not limited by the conventional chrome outer box and the chrome inner box in the prior art.

Finally, exposing the reticle on the wafer, so as to form space marks corresponding to the light-transmitting portions 11 and the openings 21 formed in the reticle on the wafer.

Although only four light-transmitting portions 11 and four openings 21 are formed as shown in FIG. 3 and FIG. 4, the invention is not limited thereto. Actually, the number of the light-transmitting portions 11 and the openings 21 can be any number equal to or greater than four.

Figure 5:
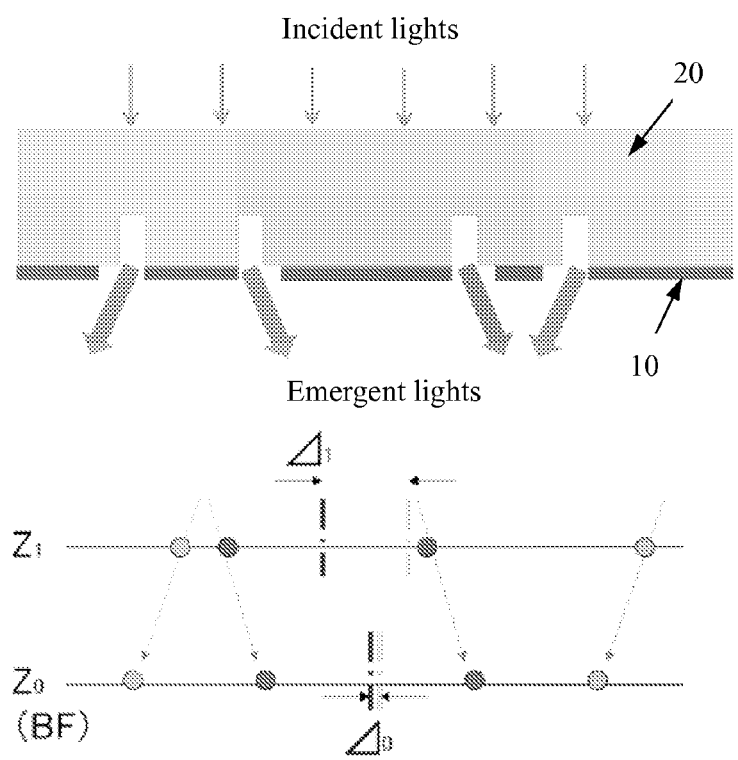
FIG. 5 is a schematic diagram of the phase shift focus monitor reticle and the method of monitoring the focus difference using the phase shift focus monitor reticle in one embodiment of the present invention.

Now referring to FIG. 5, which illustrates the method of monitoring focus difference using the phase shift focus monitor reticle, normal incident lights changes into oblique emergent lights after passing through the multiple openings 21 of the shield layer 10 and emits through the multiple light-transmitting portions 11. Then the phase shift focus monitor reticle is exposed on the wafer and space marks are formed on the wafer. Therefore, the focus difference of the lithography machine can be calculated by an overlay measuring machine according to the multiple beams of oblique lights emitted from the multiple light-transmitting portions 11 respectively. To be specific, the focus difference can be calculated as follows: firstly exposing the phase shift focus monitor reticle on the wafer by the lithography machine with different focus to form different space marks; modeling the shifts between the middle of the outer box and the middle of the inner box of the space marks exposed on the wafer with different focus measured by an overlay measuring machine; and calculating the linear relationship between the shift of the lights along the z-axis and the shift of the lights along the x-axis or the y-axis. Note that the outer box and the inner box of the space mark cover the range as shown by the arrows below the openings 21 and the light-transmitting portions 11 indicating the emergent lights in FIG. 5. During the regular monitoring of the focus of the lithography machine, the shift of the lights along the z-axis can be calculated according to the present shift between the outer box and the inner box of the space mark as well as the linear relationship. Since the focus difference is correspondent to the light shift along the z-axis, the difference between the present focus and the best focus can be also calculated according to the shift between the outer box and the inner box of the space mark.

In summary, incident lights can be emitted through multiple light-transmitting portions 11 to form the space mark on the wafer during the exposure process. Since the space mark can avoid the collapse of the photoresist, the phase shift focus monitoring method can be applied to thicker photoresist and various process machines.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A phase shift focus monitor reticle comprising,
a shield layer, comprising a plurality of light-transmitting portions with a certain width;
a glass layer positioned on the shield layer, comprising a plurality of openings at the light-transmitting portions, wherein
the width of the openings is half of the width of the light-transmitting portions; the depth of the openings is $n\lambda/(N-1)$, wherein $\lambda$ is the wavelength of the lights incident on the phase shift focus monitor reticle in air, N is the refractive index of the glass layer, n is a positive integer.

2. The phase shift focus monitor reticle according to claim 1, wherein the material of the shield layer is chrome.

3. The phase shift focus monitor reticle according to claim 1, wherein the number of the light-transmitting portions is equal to or greater than 4.

4. A manufacturing method of the phase shift focus monitor reticle comprising:
etching a plurality of light-transmitting portions with a certain width in a shield layer respectively;
etching a plurality of openings in a glass layer positioned on the shield layer at the plurality of the light-transmitting portions to form the phase shift focus monitor reticle; wherein
the width of the openings is half of the width of the light-transmitting portions; the depth of the openings is $n\lambda/(N-1)$, wherein $\lambda$ is the wavelength of the lights incident on the phase shift focus monitor reticle in air, N is the refractive index of the glass layer, n is a positive integer.

5. A method of monitoring focus difference using the phase shift focus monitor reticle according to claim 1 comprising:
step a, exposing the phase shift focus monitor reticle on a wafer by a lithography machine with different focus to form space marks corresponding to the focus;
step b, modeling the shift between the middle of the outer box and the middle of the inner box of the space marks measured by an overlay measuring machine;
step c, calculating the focus difference of the lithography machine according to the modeling result and the shift between the middle of the outer box and the middle of the inner box of the space marks.

6. The method according to claim 5, wherein step b further comprises determining the linear relationship between the shifts between the middle of the outer box and the middle of the inner box of the space marks and the different focus.

* * * * *